United States Patent [19]
Salgo

[11] 3,936,690
[45] Feb. 3, 1976

[54] MOBILE ION FILM MEMORY
[75] Inventor: Francis John Salgo, Dallas, Tex.
[73] Assignee: Butler, Binion, Rice, Cook & Knapp, Houston, Tex.
[22] Filed: Sept. 19, 1974
[21] Appl. No.: 507,278

[52] U.S. Cl. ............... 313/392; 313/394; 315/12 R
[51] Int. Cl.² ..................... H01J 31/58; H01J 29/10
[58] Field of Search ................... 313/391, 394, 392; 315/13 ST, 12

*Primary Examiner*—Robert Segal
*Attorney, Agent, or Firm*—Murray Robinson; Arthur M. Dula; Ned L. Conley

[57] ABSTRACT

A memory device and method is disclosed wherein positions of ions associated with a film are varied locally with respect to the film's surface by an electric field. A writing and erasing field is created by voltage modulating the film's conducting substrate in syncronization with low intensity electron bombardment of a local area of the film's surface by a scanning electron beam.

The ion's position in the film varies the film's surface potential and alters the angular distribution imparted by its surface to primary diffracted and secondary emitted electrons. In the invention's read mode a scanning electron beam, combined with a detector discriminator, analyzes these emitted electrons to determine the surface potential at each address on the film thus reading out data stored in the film. A second means of reading out stored information utilizing detection of low energy electrons selectively diffracted by ions near the film's surface is disclosed.

34 Claims, 14 Drawing Figures

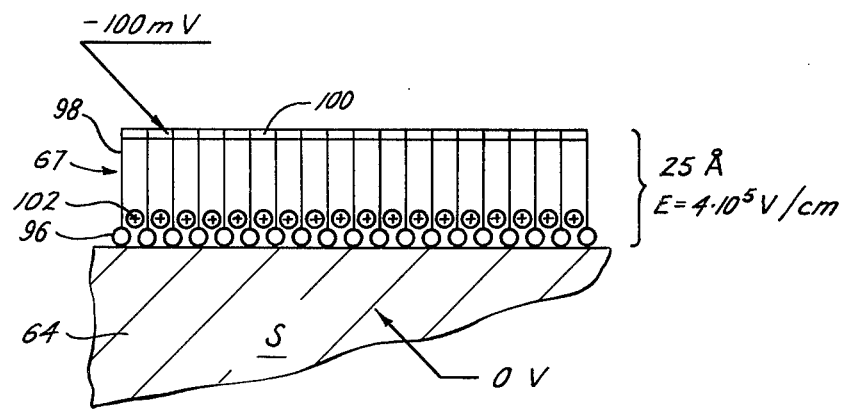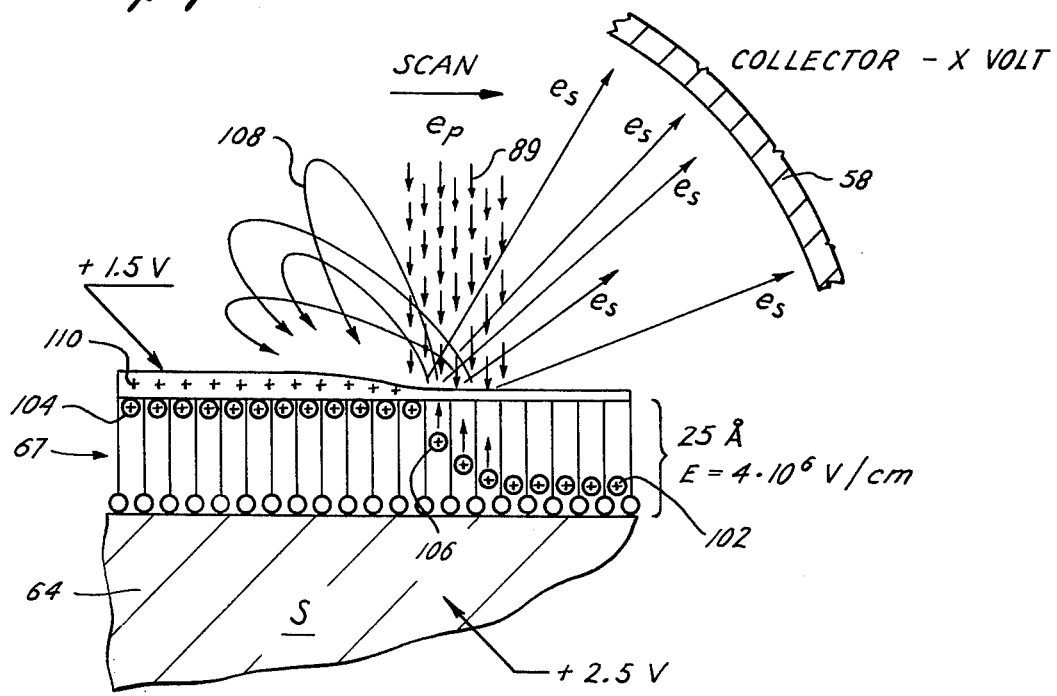

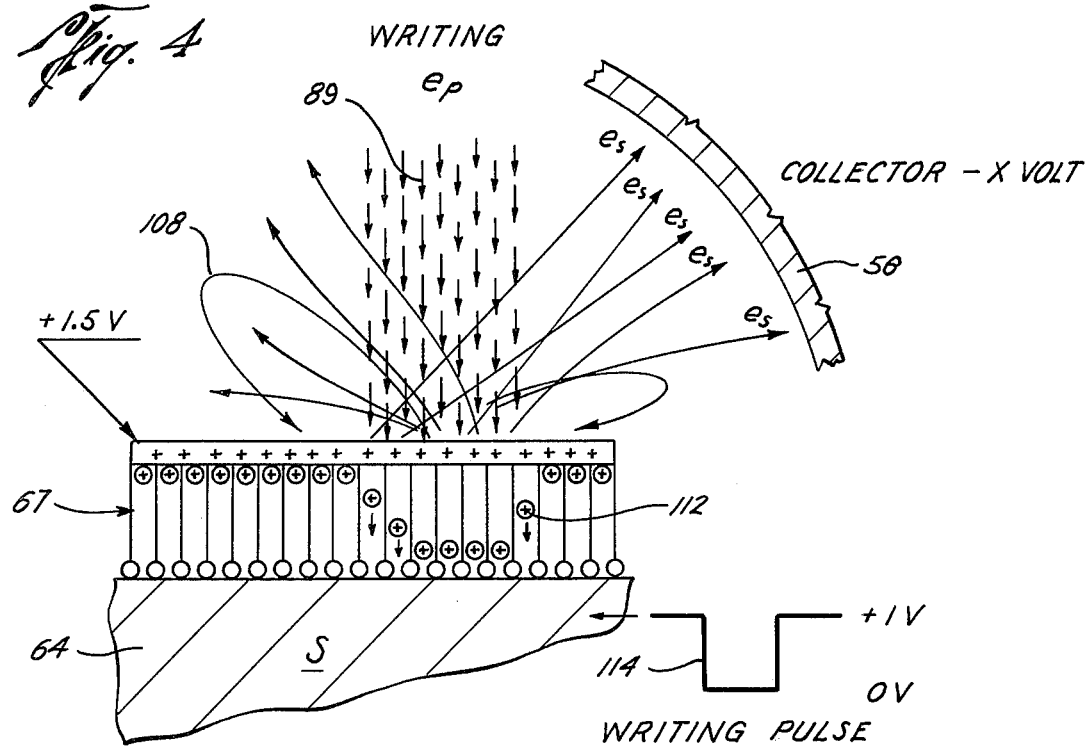
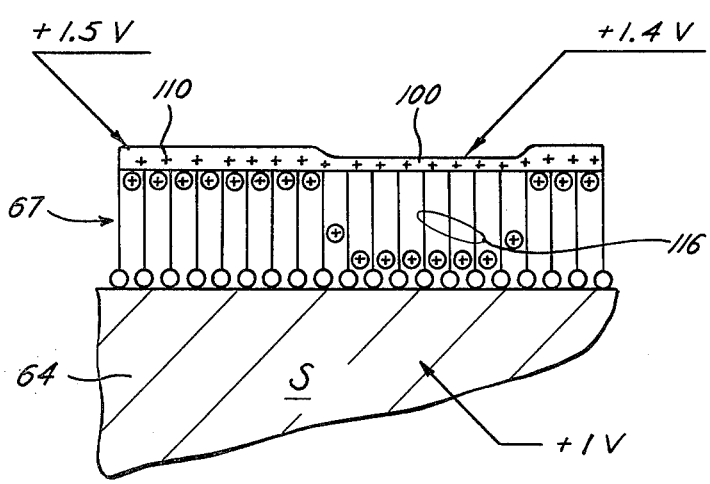

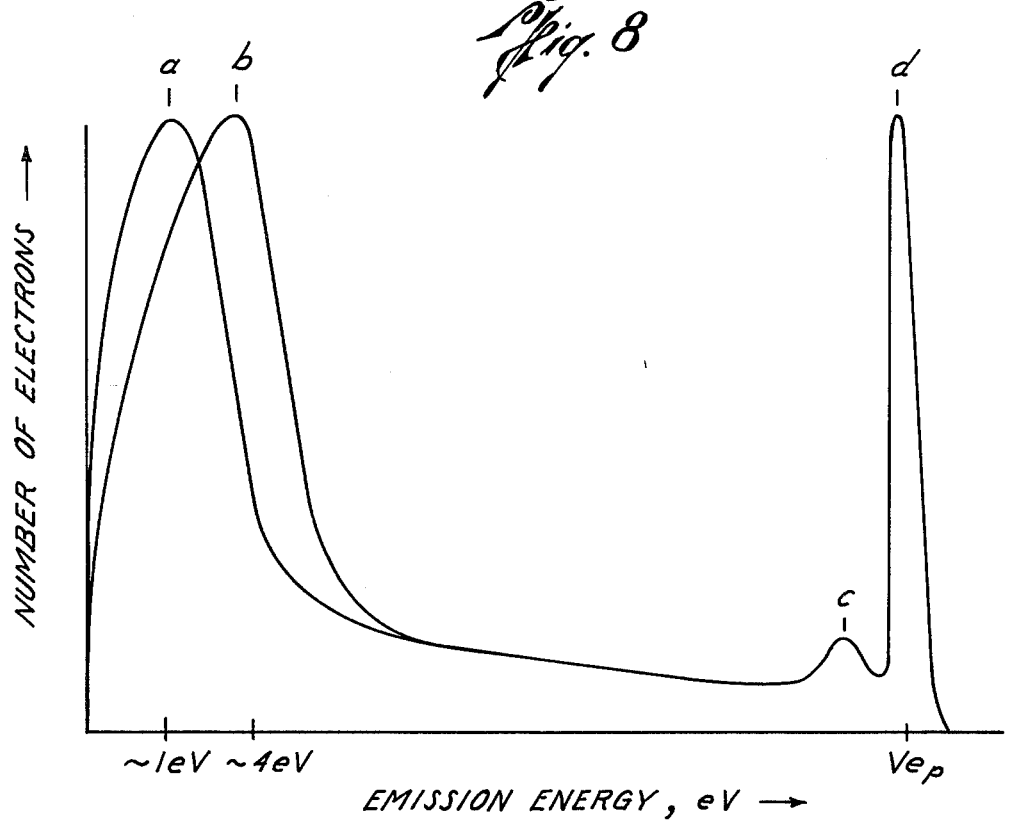
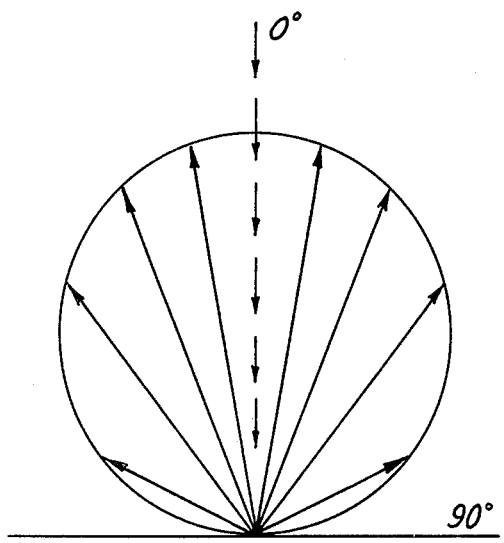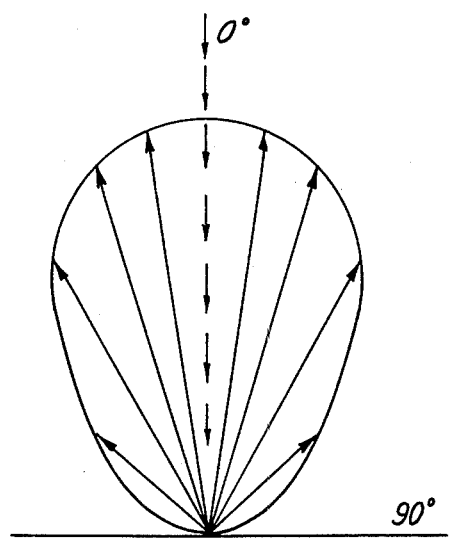

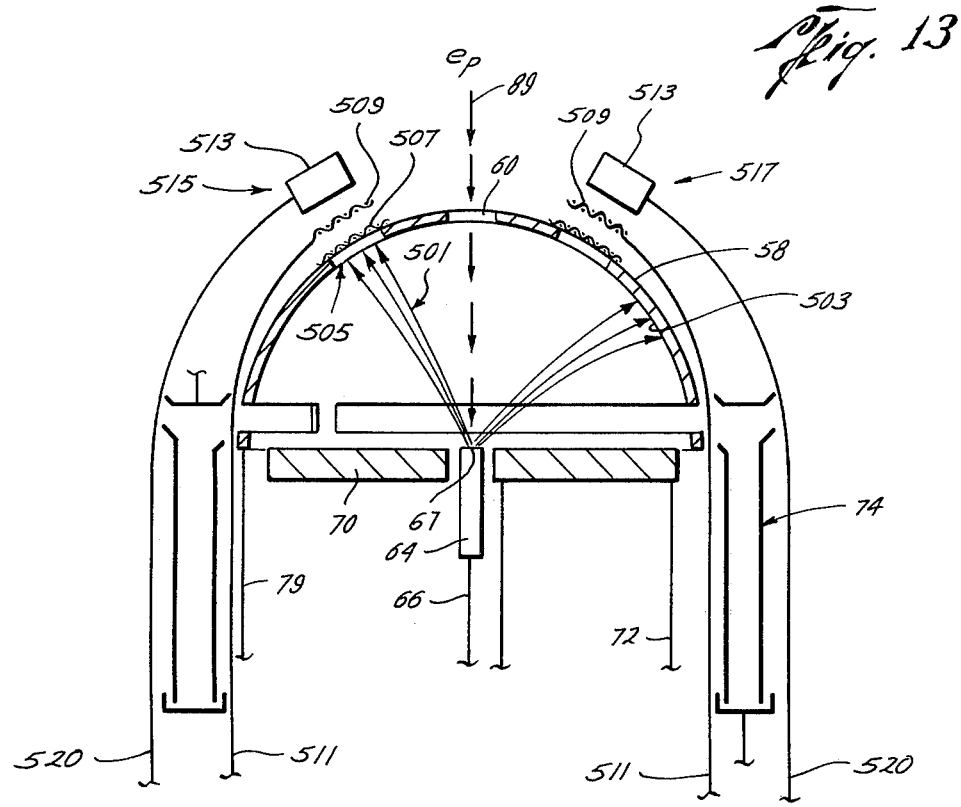
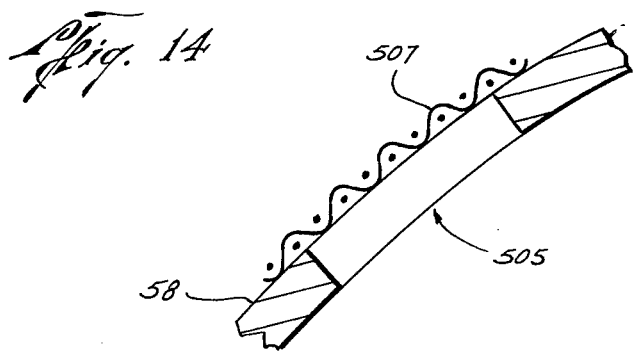

MOBILE ION FILM MEMORY

BACKGROUND OF THE INVENTION

1. Field of the Invention

The invention relates to storage of information and more particularly relates to use of an electron beam to alter properties of a thin film in order to store information in form of binary code on or in the film.

Specifically, the invention relates to storage and retrieval of information by selectively altering a film's surface potential and electron diffraction characteristics locally through selectively varying positions of associated mobile charged particles. These changes in surface potential and diffraction characteristics are detected by the invention's readout means.

2. Description of the Prior Art

Storage of information by altering some measurable property of a physical surface is old. Virtually all properties of every surface capable of reasonably certain measurement has been utilized for this purpose. A few early examples are marks on stone, physical arrangement of sand in a pattern, and this printing.

The advent of computers made necessary the storage of information in binary, or base two, format. Computers use binary arithmetic for most calculations. As they developed, need emerged to store vast quantities of information in binary format. Many systems were developed to meet this need, and most of them were quite simple. Simple solutions were possible because binary arithmetic uses only two numbers, 0 and 1. A single binary number, either 0 or 1, is called a "bit". Any information storage medium capable of assuming two measurably different states can be used to store binary bits of information. One good example of such a medium is the common IBM punch card. Information is stored in the card by punching a hole in the card at a particular address.

Digital computers were denominated "electron brains". Shortly thereafter, binary information storage units became known as computer "memories". As the state of the art in memory construction progressed, greater quantities of binary bits could be stored in smaller memories. Two classes of memories emerged. One of these is "read only" memory (ROM). In this type of memory once information has been stored it can only be used, not erased or altered. usually ROMs are created by causing some irreversible change in the material comprising a computer's memory. Two examples of ROMs are IBM punch cards and punch paper tape. Here physical holes are punched in paper by mechanical means. Other methods used by ROMs include burning small holes in plastic with light or electron beams and use of such relatively intense energy beams to alter a measurable characteristic of some material, e.g. resistance of selenium. Early computers used this type of memory in the form of physically arranged wires between terminals. ROMs are often used as archival memories for long term storage of data because they cannot easily be erased.

The other class of memory developed is eraseable memory (hereinafter "memory"). Eraseable memories store the same binary formated information as ROMs, but in them this data may be erased or altered by the computer or its operator. Operationally, eraseable memories change the observable state of memory material used to store information from the state representing 0 to the state representing 1 and vice versa.

Both types of memory can be random access memories (RAM) and allow any desired bit of information to be located and individually read by means of an "address". The address specifies the desired bit's physical location in the memory. Examples of eraseable memories are manifold. In the beginning, positions and states of electric switches or relays were used to store bits of information. A switch's "on-off" operation is compatible with the 0 – 1 structure of binary numbers. As bit density increased, information was stored in magnetic fields impressed by pulses of electricity onto small ferrite tori or "cores". This memory was used in first and second generation computers and was called "core memory". Although "core" is now a general term for a computer's main memory, ferrite core memory is still used extensively.

Memories are further classified by speed, or, the length of time required to find or "access" any specified bit of information. Core memory is fast. Newer core memories use thousands of microscopic semiconductor switches. Their speed is limited by the speed of electric signals interconnecting their parts. Slightly slower is "drum" memory. Here bits are stored in magnetic fields impressed on a ferrite coated surface of a revolving high speed drum. "Drums" provide fast external memory usually not physically contained within a computer's central processing unit. Drum memory stores, or "writes," and detects, or "reads", magnetically encoded bits with a plurality of tape heads mounted just above the drum's revolving surface.

Slower memories include magnetic discs and tapes operating on principles similar to drum memory. Finally, cathode ray tubes (CRTs) have been used as "storage tube" memory. Storage tube memories operate by bombarding a given location or "address" on the tube's coated glass front surface with a beam of high intensity electrons. These change the electrical charge deposited on the dielectric coating. A small charged spot is thus created. If the electron beam's current is reduced and it is passed over this spot, voltage in an associated circuit changes, allowing the bit to be read. A television camera tube works in a similar manner, except there the tube's "spots" are activated by photons focused by a lens on a photoelectric surface rather than by a high energy electron beam. Unfortunately, all the above discussed memories have many drawbacks. Slow, or "peripheral" memories, such as magnetic disc, tape and drum have moving parts that are subject to wear. Further they are only capable of very low information storage densities. Finally these memories are fragile, physically heavy, bulky, and consume large amounts of power per bit of memory stored.

On parameter for measurement of memory efficiency is the amount of energy required to record and read a single bit of data. Presently, energy intensive methods must be used to alter the state of material used to record information in memory. The most advanced present memories utilize light or electron beams to alter resistivity of material such as selenium[1] or to physically burn holes or cross link molecules in a thin film deposited on a conducting substrate.[2]

(1) (it requires $1.38 \times 10^{-11}$ cal. to change the resistance of a 100×100 angstrom spot.)
(2) ($6.27$ $6.27 \times 10^{-10}$ cal. and $10^{-12}$ coulombs, respectively, for a $10^4$ angstrom square spot.)

The power required to write, store, access and read a bit of information and the physical size of the area required to store a bit of information in memory are two important parameters of any memory system. Magnetic fields, as employed by the memories discussed above, require a relatively large area to store a single bit of information. Bit size in optical memory systems is limited fundamentally by the shortest useable wavelength of light. The smallest obtainable bit size is of the order of 1 micron. Thus, the greatest density obtainable using such a system is on the order of $10^5$ to $10^6$ bits per square millimeter. Increasing density by several orders of magnitude requires the use of electron beams to write and read the information. Electron beams are not, at least theoretically, limited in spot size. They are, however, limited by the beam current and its associated electronic's signal to noise ratio. Ability to control precise focusing and deflection of an electron beam and the amount of energy contained in such a beam are also considerations limiting the bit size of electron beam addressable memories. A discussion of the state of the art in this field is found in A. T. Miller, *Electron Beam Fabrication*, Solid State Technology, July 1973, at pages 25 to 29.

An electron beam used to write data onto a surface must initiate some detectable change in or on the surface so information stored thereon may be read and used. One means of writing a bit using an electron beam consists of melting, vaporizing or decomposing a hole through a thin film. Unfortunately, this system results in a non-erasable or archival memory and additionally requires a great deal of energy per bit. A high intensity electron beam can be utilized to crosslink molecules in a thin polymer film. This method uses less energy than required to melt a hole in the film, but still uses a relatively large amount of energy per bit and is non-erasable, resulting in formation of a ROM. Another, state of the art, electron beam addressable memory is now under development. This memory makes use of large difference in electrical conductivity existing between two modifications of some materials, such as selenium. Resistivity of red, crystalline selenium is on the order of $10^{15}$ ohms per centimeter, while resistivity of gray, hexagonal, so-called metallic, selenium is only 12 micro ohms per centimeter. The red form can be converted into the metallic, more stable form by heating with an electron beam. Conversion begins to take place at about 50° centigrade, but can be inhibited by addition of a small percentage of sulphur so it occurs at higher temperatures. The reaction is exothermic, it gives off heat. Selenium can be deposited on a conductive substrate and an electron beam used to heat and convert the red form to the metallic form. The conductive bit, thus created can be read by the same electron beam operating at a reduced beam current.

Again, this process requires that a large amount of thermal energy be obtained from interaction of an electron beam with the storage medium. Although this energy is considerably less than the amount required to melt a film, it still is excessive when compared with the present invention. Additionally, the exothermic nature of the conversion reaction tends to cause bit size to become larger than beam diameter. Also, as the selenium film is reduced in thickness, some electrons will penetrate through it to heat the substrate. This, in turn, will heat the selenium and cause bit diameter to grow even larger. As in the other systems discussed above, it is not possible to erase a written bit because the metallic form of selenium is not readily reconverted to the red form.

The closest approach to the present invention existing in the prior art known to the inventor is an electron beam addressable memory developed by the Stanford Research Institute, which was recently delivered to the Avionics Laboratory of Wright Patterson Air Force Base. This electron beam addressable memory, according to reports (Modern Data, May 1974 at page 14), apparently uses a silicon dioxide layer on silicon as its memory material. The electron beam, reportedly, can write on, read from or erase this silicon target. This memory is built by forming a layer of silicon oxide on a silicon chip, then photolithographically etching a matrix through the oxide layer to form a plurality of silicon oxide insulating islands surrounded by conductive silicon channels. As an electron beam is swept across this matrix its intensity is modulated to place negative charges on these silicon oxide islands in a well known manner. The signal is then read by conventional storage tube methods described by Kazan (see reference Infra).

Unfortunately, data density in this memory is limited to not more than $10^6$ bits per square millimeter by the state of the art in photolithography. Additionally, the storage medium is difficult to produce and most, though not all, of the readout methods used to detect the charge on the silicon oxide islands alter or destroy the charge during the readout operation.

SUMMARY OF THE INVENTION

The present invention uses the effects resulting from varying the position of mobile ions within a thin film as a memory storage medium.

Generally the present invention comprises: a data storage apparatus having a plurality of charged particles, said particles being selectively moveable to a plurality of positions in a film by a writing means, i.e. an electron beam, and a reading means. The reading means generally comprises an analyzer means for determining the presence or absence of a bit at any given address on the film's surface.

Deflection coils, focus coils and electrodes are provided to control the electron beam's position, sweep velocity, and intensity. A modulated potential, synchronized with the electron beam's position, is applied to the conducting substrate in contact with the film. This synchronized potential, in combination with the electron beam, varies the position of excess mobile ions in, for example, a barium stearate film. The positively charged mobile ions' positions alter the Langmuir film's surface potential. Data written onto the film by the preferred embodiment of the invention appears as differential surface potentials at different addresses on the film's surface. Mobile ions in the film will either be near the surface or base of the stearate stalk of the barium stearate film depending on the state (0 or 1) of the particular bit storage address.

To read stored information out of the film, an electron beam scans the Langmuir film's surface at a reduced beam current. Low energy electrons, on striking the Langmuir film, penetrate some short distance into its surface. Potentials applied to the electrodes surrounding the Langmuir film are adjusted until some secondary electrons escape from the film. Velocity and angular distribution of these emitted secondary electrons are used to select electrons emitted from a surface having a selected surface potential, which indicates the presence of a bit at that address. The memory is provided with a detector and analyser to select these electrons. After selection they are amplified by a secondary emission multiplier to read out the stored information.

A second readout mechanism is provided employing reflected primary electrons. Primary electrons penetrate a short distance into the film's surface. They are diffracted by electron fields in the outer electron shells of mobile ions close to the film's surface. Because of its low energy, the scanning electron beam will not penetrate through to the bottom of the Langmuir film. The electron shells of the mobile ions diffract the reflected primary electrons to produce a known diffraction pattern. This pattern is detected by properly positioned detectors behind holes in the tube's collector electrode. Presence or absence of ions at the film's surface at the particular bit address irradiated by the electron beam may thus be determined.

Physically, the information storage region of the memory would be relatively small, on the order of 1 square millimeter. The tube itself is about 4 square inches in cross section by 8 to 12 inches long aand may be made of glass. The technology used to make the tube is well known to anyone skilled in the art of electron storage tube design.

BRIEF DESCRIPTION OF THE DRAWING

FIG. 2 is a diagramatic representation of the barium stearate film used as a storage medium in the preferred embodiment of the invention seen in cross section;

FIG. 3 is a diagramatic illustration of the Langmuir film shown in FIG. 2 in the condition of being bombarded by an electron beam during the priming operation of the preferred embodiment of the invention;

FIG. 4 is a diagramatic illustration of the Langmuir film of the preferred embodiment of the invention shown in cross section in the condition of having a bit being written into it;

FIG. 5 is a diagramatic illustration in cross section of the barium stearate Langmuir film used by the preferred embodiment of the invention as a memory storage medium illustrating diagramatically the difference in surface potential between a bit and a non bit;

FIG. 8 is a graph of number of electrons emitted by a surface plotted against emission energy of electrons and used to explain operation of the invention;

FIG. 9 is a diagramatic representation of the angular distribution of emitted secondary electron in the preferred embodiment of the invention;

FIG. 10 is a diagramatic representation shown in cross section, of the angular distribution of scattered primary electrons in the invention;

FIG. 13 is a longitudinal cross sectional view of another embodiment of the readout means of the invention; and FIG. 14 is a cross sectional view of a portion of the embodiment shown in FIG. 13.

DESCRIPTION OF THE PREFERRED EMBODIMENT

The present invention has a great number of possible embodiments. The storage film may be ordered, or morphis; the physical memory tube may be of any desired shape; the thin film used to store the movable charged particles may be of protein, a Langmuir film having any polar hydrophilic head and any organic hydrophobic tail, or it may be an inorganic film whose physical and dialytic properties permitted to store a plurality of charged particles in a plurality of differing positions; the control means may be electrostatic or electromagnetic or a combination of the two; and the control element geometries and potentials are only constrained by the necessity that they adequately control the reading and writing means of the invention. For the purpose of this specification, applicant is describing a specific embodiment of the invention using a cylindrical memory tube longer than its diameter having a barium soap, i.e. barium stearate, monomolecular film deposited on a carbon substrate. The reading and writing means use electrodes of specified geometry and specified potential. This embodiment is being presented in nthe specification only because the physical, electrical characteristics of barium stearate are well known and it serves as a good example of the class of films that could be utilized by the device. Many other embodiments could be shown equally well, but this would make the specification prolax. The applicant specifically claims all the embodiment of the present invention in the claims, and the specification should not be read to limit these claims.

Figure 1:
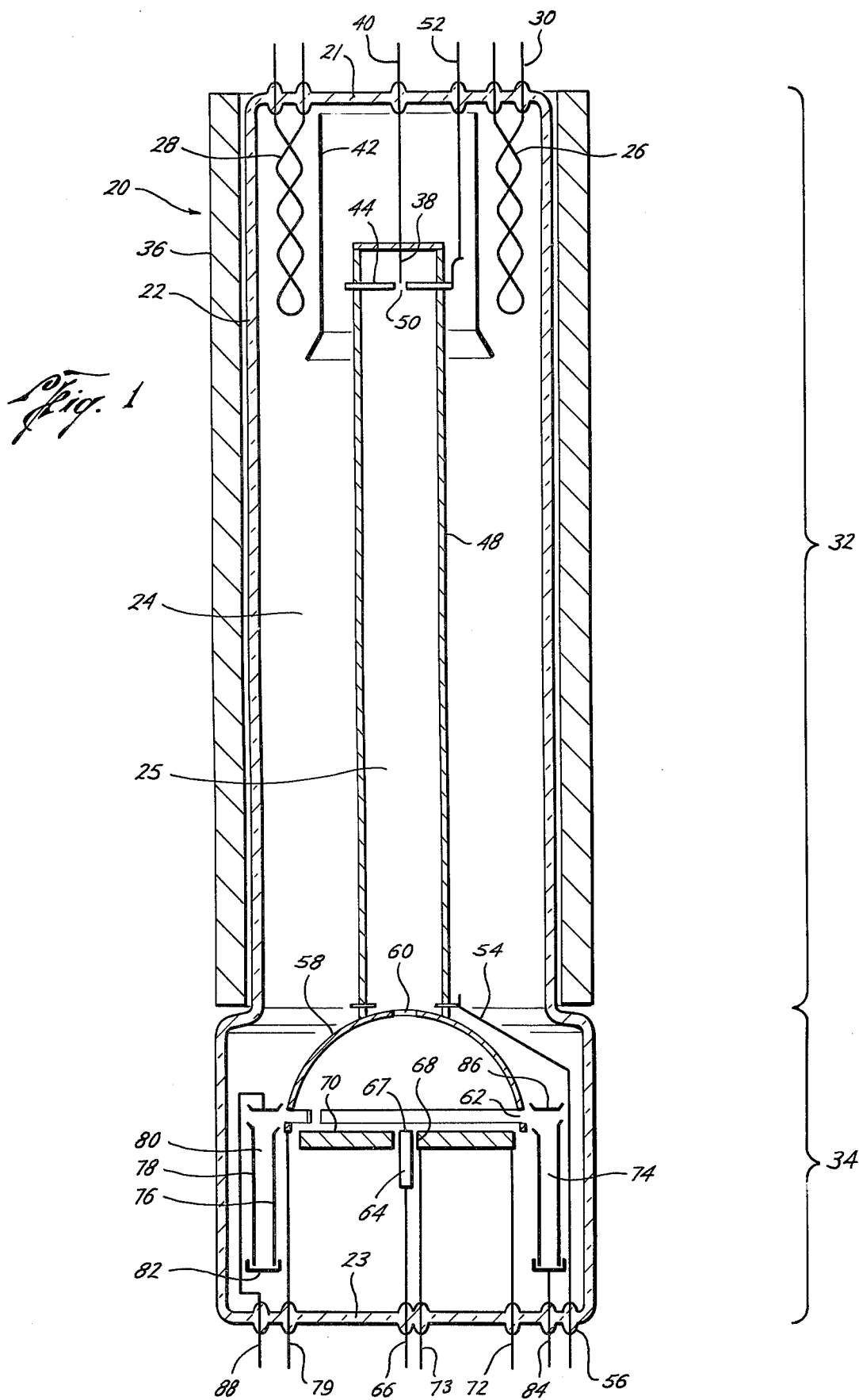
FIG. 1 is a longitudinal cross sectional view of a memory tube according to an embodiment of the invention.

In FIG. 1 of the drawings, memory tube 20 is shown in longitudinal cross section. Cylindrical glass envelope 22, having ends 21 and 23, is hermetically sealed and surrounds an evacuated space 24 which contains the operative elements of the memory. Titanium sublimation pumps 26 and 28 are located within the upper end of tube 20 radially inboard of wall 22 and connected to terminals 30 that penetrate end 21 of the tube. The tube is divided into an electron beam control portion 32 and a read in/read out control portion 34. A set of focus and deflection coils 36 axially surround upper, or beam control portion 32, of tube 20. Within beam control portion 32 a field emission cathode 38 is mounted in approximate coincidence with the longitudinal axis of tube 20. Field emission cathode 38 is connected to terminal 40 that penetrates end 21 of tube 20. The titanium sublimation pumps in the upper portion of tube 20 are inwardly radially shielded from emission cathode 38 by shield 42. An accelerating grid 44 is mounted within a decelerating tube 48 that axially surrounds field emission cathode 38. The grid is provided with an opening 50 in approximate coincidence with the end of field emission cathode 38 and is attached to terminal 52 that penetrates glass envelope 21 of tube 20. Deceleration tube 48 is located uniformly radially inboard of glass envelope 22 of memory tube 20 and extends from a point above field emission cathode 38 to below beam control section 32 of the memeory tube. Deceleration tube 48, connected to terminal 54, penetrates bottom 23 of memory tube 20 at glass nipple 56.

Read out detector section 34 of memeory tube 20 is radially larger than beam control section 32 and contains hemispherical collector 58 which is made of a suitable conductor and has an opening 60 provided about the longitudinal axis of the tube. Collector 58 is electrically connected to conducting terminal 79 that penetrates base 23 of tube 20. Second opening 60 is approximately on tube 20's longitudinal axis in a direct line with opening 50 in accelerating grid 44 and the approximate center of deceleration tube 48. Collector 58 is provided with a velocity selector slit 62 running annularly around the collector at a point near its base. Directly below hemispherical collector 58, located coaxially with field emission cathode 38, acceleration grid 44, and opening 60 in the top of collector 58, is a conductive substrate 64 connected to a terminal 66 that penetrates lower end 23 of memory tube 20. Substrate 64 fits into a circular opening 68 provided in a deflector 70. Deflector 70 is located radially inboard and just below hemispherical collector 58. Deflector 70 is connected to terminal 72 at its outer periphery and terminal 73 connected to its inner periphery.

A secondary emission multiplier 74 is located radially outboard and slightly below annular opening 62 in collector 58. Emission multiplier 74 is provided with a first wall 76 annularly inboard of a second wall 78, therebetween defining a multiplier space 80. At the lower end of multiplier space 80 is an orthogonally running ring 82 electrically connected to a lead 84 that penetrates glass envelope 23 of memory tube 20. A velocity selector control ring 86 is provided radially outboard and annularly surrounding collector 58 just above annular opening 62. This velocity selector element is radially coordinate with and above the upper ends of walls 76 and 78 in emission multiplier 74. Velocity selector ring 86 is attached to terminal 88 that penetrates lower end 23 of memory tube 20.

A mono-molecular langmuir film 67 is located on the top surface of substrate 64. This film is the active memory element of the preferred embodiment of the invention.

It should be noted that memory tube 20 is cylindrical and virtually all of its elements (used in the beam control and readout sections of the tube) are either cylinders, cylindrical sections, or rings, with the exception of collector 58, which is a hemisphere. Thus, field emission cathode 38, opening 50 in accelerating grid 44, top opening 60 in collector 58, Langmuir film 67, and film substrate 64 are all located on a center longitudinal axis of tube 20; all control elements, structurally described above, form concentric cylinders, hemispheres, or rings about them.

Memory tube 20 may be conveniently dimensioned approximately 8 inches long by 2½ inches in diameter including control coils 36. This allows a large "ballast" space to compensate for some internal outgassing of control surfaces and other elements within glass envelope 22 of the memory tube. Annular disc defelctor 70 is preferably made of ceramic material coated with an high resistivity carbon film to properly shape radial potential distribution of the electric fields surrounding Langmuir film 67. Small current flowing between the inside and the outside peripheries of this disc causes a potential drop across the non-linearly shaped resistivity of its carbon coating. The precise non-linearity of this coatings resistance is adapted to generate an electrostatic field that causes optimum deflection of secondary electrons in the desired energy range through selector slit 62. Other materials used in construction of memory tube 20 are well known and all technology required to build the tube is well within the state of the art of electron beam control. The state of the art in this field is shown by C. W. Oatley, W. C. Nixon and R. F. W. Pease, *Scanning Electron Microscopy*, Advances in Electronics and Electron Physics, (1965); and R. T. Miller, Electron Beam Fabrication, *Solid State Technology*, at page 25 (July 1973).

FIG. 2 diagramatically illustrates a cross-section of barium stearate Langmuir film 67 resting on carbon substrate 64. The barium stearate film is one molecular unit thick or, as shown in the drawing, approximately 25 angstroms thick. Barium atoms 96, which are shown as small circles, rest proximate the substrate's surface and stearate stalks 98 extend upward from the substrate for approximately 25 angstroms. This results from the method of making the film, described below. The film contains excess ions 102, which are shown as small circles containing a + sign. These may be either barium or sodium ions and, in the preferred embodiment of the invention, lie between the stearate stalks. Being charged particles, these ions can be moved between the bottom and top of Langmuir film 67 by a sufficiently high electric potential gradient. If the bottom, or barium side 96, of the Langmuir film and the substrate are assumed to be at zero volts, as shown, then the top of Langmuir film 67 has a naturally occurring negative surface potential of 100 millivolts. A potential of 100 millivolts across 25 angstroms yields a electric field with a potential gradient of $4 \times 10^5$ volts per centimeter. As will be shown, a change in substrate potential can cause a sufficient change in field gradient between top and bottom of Langmuir film 67 that, when the film is bombarded by an electron beam, excess ions 102 will move up between the stearate stalks 98 to the top of the Langmuir film and their positive charges will increase the potential of the surface 100 locally at such points.

In the preferred embodiment of the invention, Langmuir film 67 is made of barium stearate. To make a barium stearate Langmuir film, the long chain fatty acid, stearic acid, with 18 carbon atoms in its chain, a carboxyl group on one end and methyl group on the other, is dissolved in a solvent, e.g. benzene (30 milligrams per hundred grams of benzene). A drop or two of this solution is then placed on a clean water surface where it immediately spreads until the film is only one molecule thick. The water should contain a soluble barium (or calcium, strontium, lead, silver, cadmium, etc.) compound such as $BaCl_2$ or Ba acetate. The stearic acid will react quantitatively with the barium ions to form insoluble barium stearate. This is a common and well-known way to make barium soap. As the barium stearate is insoluble in water, the stearic acid film will be converted into a barium stearate film. The percentage of stearic acid reacting with barium ions depends strongly on the ph (hydrogen ion concentration) of the subphase solution. To convert all stearic acid molecules to barium stearate, the pH has to be above 9.5 (Gaines, *Insoluble Monolayers at Liquid-Gas Interfaces*, Interscience, New York 1966, at page 230). Excess ions may be placed in the film by bathing the film in a solution containing the desired ions. The technique required to deposit films consisting of monomolecular layers of barium stearate and other fatty acids was developed by Dr. Irving Langmuir and Dr. Katharine Blodgett at General Electric in the 1930's. (Blodgett, 57 J. Am. Chem. Soc., 1007 (1935)). A remarkable feature of such a film spread on water is that all its molecules are aligned with their hydrophilic carboxyl groups in contact with the water's surface and their hydrophobic methyl groups pointing straight up. By pulling a glass slide or metal plate through the film and out of the water, a layer of barium stearate, one molecule thick, will attach itself to the glass surface. The slide, or, in the case of the preferred embodiment of the invention, a vitreous carbon substrate, now has a coating of one monomolecular layer of barium stearate on its surface, with the carboxyl group attached to the surface of the substrate and the methyl group pointing away from it. The film should be formed at a surface pressure, tempature, and solution pH sufficient to cause vertical alignment of and strong Van der Waals attraction between its organic stalks. The hydrophobic character of this surface is evident from the fact that the slide emerges from the water completely dry. This monomolecular layer is 25 angstroms thick, the length of the stearic stalk of the barium stearate molecule. Vitreous carbon is used as a substrate for several reasons. First, vitreous carbon does not form an oxide layer on its surface. Second, its work function is high and its secondary electron emission coefficient is low. This allows most of the secondary electrons generated by the electron beam bombardment to originate in the thin film. Finally, it is as hard or harder than glass, very rigid, and can be ground flat and very highly polished to obtain a flat surface.

As a result of being bathed in an ionic solution, the Langmuir film has incorporated within its volume, actually absorbed on its carboxylic group plane, an excess of positive ions (in this case barium ions, but sodium ions and other ionic species may be used) (Goranson, Zisman, Electrical properties of Multilayers, *Journal of Chemical Physics*, Volume 7, Page 204 (1939)). The surface charge of barium stearate has been calculated as $6 \times 10^{10}$ electrons per square centimeter, or one positive charge per 830 stearate groups. This generates a potential field of $4 \times 10^5$ volts per centimeter across the 25 angstrom thick film. This ionic charge causes the film's surface to exhibit a potential of some 100 millivolts, as was noted earlier, when measured against the conductive substrate. Barium stearate film is deposited as a monohydrate. As the storage film has to operate in a very high vacuum, water of hydration must be removed or it would contaminate memory tube 20. This may be done by vacuum baking. The vitreous carbon substrate, whose surface is coated with a barium stearate Langmuir film, is vacuum baked at 50° centigrade for several hours to remove attached water molecules quantitatively. The Langmuir film coating the substrate will then, when viewed in cross-section, approximate the condition shown diagramatically in FIG. 2.

FIG. 3 shows a view of substrate and Langmuir film in the condition of being primed by electron beam 89, which causes ions 106 to move from bottom 102 to top 104 of Langmuir film 67. During this operation the substrate is charged to a potential of 2.5 volts relative to its zero ground potential. This charge places an electrical potential gradient across the 25 angstrom thick Langmuir film of approximately $4 \times 10^6$ volts per centimeter. This gradient is sufficient to cause mobile ions, illustrated diagramatically in FIG. 3 by small circles with crosses inside them, to move to the top of the stearate stalks of the barium stearate molecules. The presence of these positively charged units near the surface of the Langmuir film raises its surface potential, shown diagramatically as thickness 100, and increases the energy required for secondary electrons to escape from the film's surface.

Attention is now directed to FIGS. 7, 8, 9 and 10, which are graphs illustrating some characteristics of secondary electrons and their emitting surfaces. When primary electron beam 89, having a beam current on the order of $10^{-10}$ amps sweeps across the surface of Langmuir film 67 in FIG. 3, it has a beam diameter of approximately 100 angstroms. As electrons in the scanning beam strike the surface of the Langmuir film they penetrate some distance into the film. The degree of penetration depends on the potential of electron beam 89. In the preferred embodiment of the invention the electron beam will have a potential of less than 100 volts. Energy is transferred from the relatively energetic beam electrons penetrating the film to electrons within the film. The energies of these excited electrons in the film are randomly distributed in all directions. Some electrons will move toward the film's surface. If electrons thus excited and traveling in the direction of the film's surface have sufficient energy to overcome the film's surface potential, then they will be emitted as secondary electrons. It is important to remember that an electron's energy must be at least equal to or higher than the film's surface potential in order to overcome this potential and escape from the film.

Figure 7:
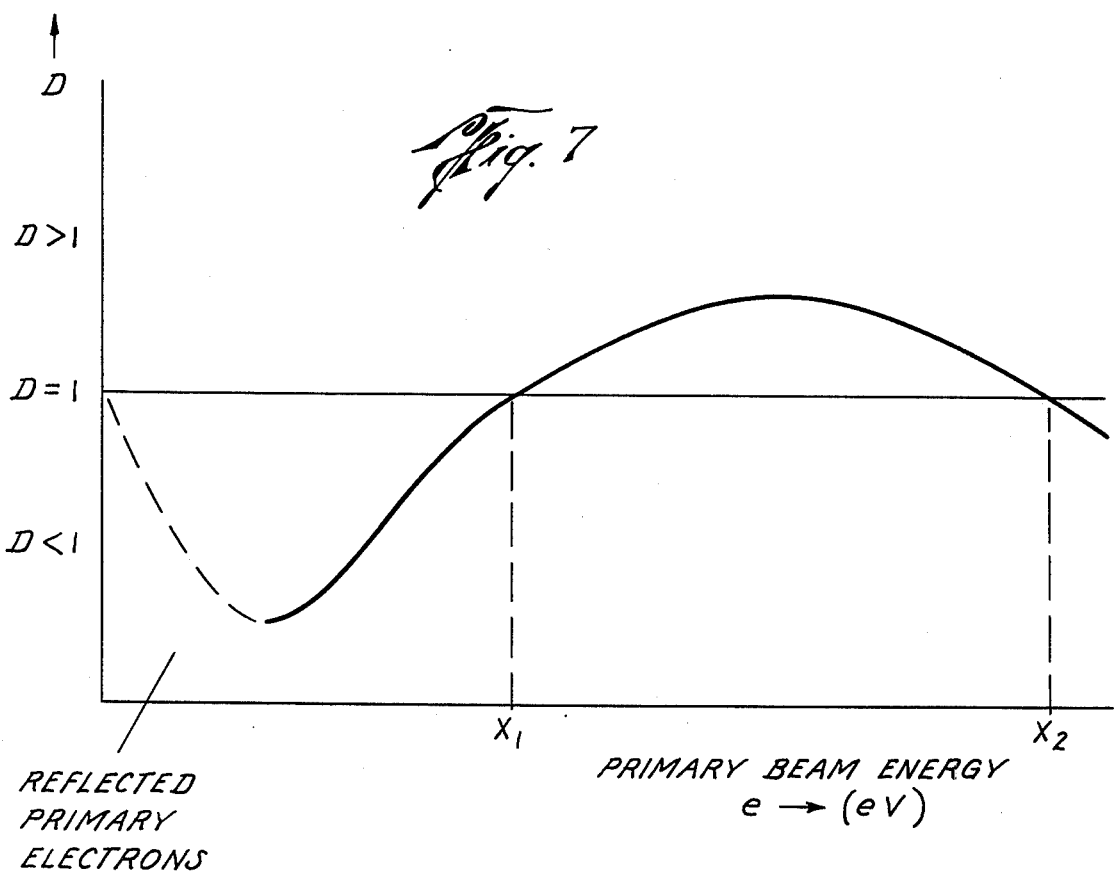
FIG. 7 is a graph illustrating the approximate relationship between secondary emission ratio and primary electron beam energy and used to explain the preferred embodiment of the invention.

FIG. 7 shows the relationship between beam energy and the number of secondary electrons emitted by a surface. Horizontal line $D = 1$ on the drawing represents the unity replacement line or unity yield line of the surface. This is an intensity of primary beam energy where one secondary electron is emitted for each primary electron that strikes the surface. At very low energies, represented by that part of the curve to the left of $X_1$ on the primary beam energy axis, electrons striking the film's surface will not contain enough energy to cause an equal number of electrons to be emitted from its surface. When beam energy reaches $X_1$, and this energy level differs for differing materials, each electron in the primary beam striking the film's surface causes one secondary electron to be emitted from the film. At energies higher than $X_1$ on the primary beam energy axis, in that part of the curve between $X_1$ and $X_2$, each primary electron striking the film's surface statistically causes more than one secondary electron to escape from the film. The film will thus gradually take on a positive charge as negative electrons escape from it. This positive charge increases until it causes the return of enough low energy secondary electrons to balance the number leaving. As the electron beam energy increases, primary beam electrons penetrate deeper into the film. This means the surface directed component of secondary electrons becomes smaller. Eventually fewer secondary electrons will be able to escape from deeper within the film. This is represented on the curve by downturning of the secondary emission ratio curve until it passes through the unity yield line at $X_2$, which represents a value for the primary beam energy beyond which each electron in the primary beam penetrates so far into the film that fewer than one electron is emitted due to its interaction.

FIG. 8 shows the number of electrons emitted by a surface plotted against their emission energy. Peak $d$, located at energy level $V_{ep}$ represents elastically reflected primary electrons. The potential of Vep will be the same as the potential of the primary electron beam impinging on the surface. Smaller peak $c$ represents elastically reflected primary beam particles, which transfer some of their energy to the electrons within the thin film. Far lower on the energy scale than these peaks are secondary electron emission peaks $a$ and $b$. Peak $b$, located at approximately $4eV$, represents the statistical energy distribution of secondary electrons emitted from a conductor, such as a metal. Peak $a$, which is centered approximately about one electron volt, represents the statistical energy distribution of secondary electrons emitted from an insulator or an organic material such as the barium stearate Langmuir film as used in the preferred embodiment of the invention.

FIG. 9 shows a cross-sectional view of the angular distribution of emitted secondary electrons emitted from a thin Langmuir film as used in the preferred embodiment of the invention. This distribution approximates a normal cosine distribution and is independent of the angle formed between the film's surface and the incident primary electron beam. This is because primary beam electrons penetrate the film's surface and transfer their energy to excited secondary electrons. The vertical component of these excited secondary electrons form the energy distribution pattern shown in FIG. 9. In contrast to this, FIG. 10 shows a cross-sectional view approximating the angular distribution of scattered primary electrons, such as those illustrated by peaks $c$ and $d$ of FIG. 8, reflected by the Langmuir film used in the preferred embodiment of the invention. This cross-section distribution is pear-shaped and will tend to follow the primary electron beam because it is merely a reflection by the film's surface of the electrons in the beam.

Returning for a moment to FIG. 7, it will readily be observed that primary electron beam energies smaller than $X_1$ and larger than $X_2$ will cause the Langmuir film's surface to acquire a negative charge. More electrons are arriving by means of the primary beam than are leaving the surface by means of secondary emission. At primary energies between $X_1$ and $X_2$, the film loses more electrons by secondary emission than it receives from the beam and thus will gain a positive charge somewhat beyond the collector potential placed upon collector 58 in FIG. 3. This positive charge will continue to accumulate until the gradient between the substrate surface and the collector is negative and causes enough emitted secondary electrons to return to the surface of the Langmuir film to balance the number leaving the film.

In FIG. 3 primary electron beam 89 is scanning the surface of Langmuir film 67 in a direction represented by the arrow labeled SCAN. When electrons strike the surface of the Langmuir film, they cause secondary emissions as discussed above. The potential of the electron beam, its primary beam energy, is adjusted until it falls between first and second crossover potentials, as illustrated on the graph in FIG. 7. This causes the Langmuir film to emit more electrons by secondary emission than it receives from the primary beam. The presence of the negative electrical charges represented by electrons in the primary electron beam will attract positively charged mobile ions represented in the drawing by small circles with crosses inside them. These mobile ions 106 are capable of moving along the stalk of the barium stearate molecule, if an electric field of sufficient gradient is placed between the top and bottom of the film. This is accomplished by placing a positive charge on the substrate 64. This 2.5 volt positive charge on the substrate creates a potential gradient across the Langmuir film, with respect to the 1.5 volt positive charge on the film's surface, of $4 \times 10^6$ volts per centimeter. The positive charge at the Langmuir film's base establishes a negative gradient between the bottom and the top of the film in the portion of the Langmuir film lying directly under the primary electron beam. This causes the positively charged ions to move to the film's surface. As has been noted above, the potential of collector 58 is adjusted, in the preferred embodiment of the invention, until a surface charge of +1.5 volts exists where the scanning electron beam has passed and the mobile ions have risen to the surface of the Langmuir film. The film will be scanned in a raster pattern by the electron beam and the Langmuir film's entire surface will be charged to a surface potential of 1.5 volts. Further irradiation by the electron beam will have no effect because the potential gradients between substrate, Langmuir film, and collector is such that any additionally emitted secondary electrons will return to the Langmuir film's surface as shown diagramatically by the curved tracks of secondary electrons 108. Any additional positive charges created on the surface of the film by faster electrons leaving the surface are immediately neutralized by returning slower electrons that are repelled by the negative gradient between the surface and the collector. Once the entire surface of the Langmuir film has been charged to a uniform surface potential of +1.5 volts and all of the mobile ions in the film have been moved close to the film's surface, the surface is said to be primed and is ready for information to be written onto it. Erasure of a bit of stored information is accomplished by priming its address on the film.

FIG. 4 shows a magnified cross-sectional diagramatic view of the primed film shown in FIG. 3 in the condition of having a bit of information written into it.

Primary electron beam 89 has a current of approximately $10^{-10}$ amps during this writing operation. The beam impinges upon the surface of Langmuir film 67 and causes secondary electrons to be emitted. The beam's position on and velocity across the film are determined by the beam control coils as discussed above. Secondary electrons, shown diagramatically by electron 108, are repelled by the potential of collector 58 and immediately returned to the surface of film 67. The other secondary electrons shown in the drawing possess greater energy and, under the influence of the electrostatic potential established by the deflector 70, impact at some point on collector 58. When the beam reaches an address where a bit is to be written, substrate 64 is dropped from a potential of plus 1 volt to zero volts by synchronized negative going write pulse 114. There is thus established a negative gradient in direction of the bottom of the Langmuir film. This gradient, however, is not great enough to cause mobile ions 112 to migrate from top to bottom of the film. Normally, the entire film's surface potential would "follow" the pulse. In the area bombarded by the electron beam a +1.5 volt surface potential is maintained by secondary electron emission. The electron beam is approximately 100 angstroms in diameter and the bit size, the area of Langmuir film required to contain one bit of information, is thus a circular spot approximately 100 angstroms in diameter.

There is now a 1.5 volt positive potential on the surface of the Langmuir film and a zero volt potential at the bottom of the film. The electron beam maintains the bit area at its positive equilibrium potential through secondary emissions of electrons during the application of the negative writing pulse. The writing pulse generates a negative gradient of $5 \times 10^6$ volts per centimeter in the direction of the substrate across the area under electron bombardment. This causes positive ions to migrate from the film's surface toward the barium atoms at its base within the area irradiated by the primary electron beam. The nonbombarded area of the film, that portion of the film not contacted by the primary electron beam, returns to its original state at the end of the pulse. It is not "connected" by the electron beam. After the write pulse ends and charge neutrality reestablishes, the surface potential in the bit area is lower by approximately 100 millivolts than surface potentials in non-written area. This less positive surface of the bit area will also have a higher secondary electron yield than more highly positive surface areas surrounding it because electrons having energies of +1.4 volts can now escape from the film's surface at these points.

FIG. 5 diagramatically illustrates the bit written in FIG. 4. Langmuir film 67 has surface potential 110, whose thickness corresponds to surface potential voltage. The thick area shown with many small plusses is at a potentiial of 1.5 volts relative to ground level of the memory tube. Written area 100, containing a bit, has surface potential of 1.4 volts, and is indicated by a diagrammatic depression of surface potential in the figure. As is schematically shown, barium ions in the bit area have migrated down stearate stalks of barium stearate molecules in the monolayer and presently are in position near barium atoms at the monolayer's base. As mentioned earlier, substrate 64 has been returned to a potential of 1 volt.

General operation of the memory tube will now be described.

Electrons are emitted from the point tip of field emission cathode 38 because of the intense electric field generated by accelerating grid 44. These electrons, having attained a relatively high velocity, pass through opening 50 in accelerating grid 44 and enter space 25 within decelerating tube 48. Movement of electrons down decelerating tube 48 is limited by a decelerating field uniformly applied along the tube's length. This field slows electrons, which is equivalent to causing each electron to possess lower potential (1 to 100 volts). Slowed electrons pass through opening 60 in the top of collector 58 and strike Langmuir film 67 on the surface of substrate 64. The preferred embodiment of the invention teaches a beam bombardment angle of 90°, but any angle, especially an acute angle, may be used to practice the invention. The potential geometry of the electric fields generated by hemispherical collector 58 and deflector 70 further adjust the electron beam to a precisely controlled potential. Upon striking Langmuir film 67, the electron beam alters the surface potential and ionic distribution of the film, as will be later described in detail.

Magnetic fields generated by deflection control coils 36, which surround beam control section 32 of memory tube 20, are modulated in a well known manner to cause the electron beam to sweep across the surface of Langmuir film 67. Total deflection imparted by these fields to the electron beam is preferably no more than about 1°, but this deflection can vary depending on the geometry utilized by the control electrodes of the particular embodiment of the present invention. In the preferred embodiment of the invention the electron beam sweeps the surface of Langmuir film 67 in a regular raster pattern like, though much finer than, the raster pattern produced in a television camera tube. However, any other regular pattern or even random addressing of the beam's position could be substituted for this regular raster. The potential applied to collector 58 is adjusted so impact of electrons from the beam on the surface of Langmuir film 67 produces a change in position of the ions in that film if, and only if, a sufficient contemporaneous voltage is simultaneously applied through terminal 66 to conducting substrate 64. As will later be described, this places an extremely high electric field gradient across very thin Langmuir film 67. In turn the gradient causes mobile ions in the film to move and alter the film's surface potential. In normal operation of the preferred embodiment of the invention, all mobile ions in Langmuir film 67 would either be brought to the top or bottom of the film. This would be accomplished by placing an appropriate charge on conducting substrate 64 and then sweeping the entire surface of film 67 with an electron beam. The electron beam current used in this preferred manner of operation is on the order of $10^{-10}$ amperes.

To write information into the memory's surface, deflection coils 36 sweep the electron beam across the surface of Langmuir film 67 and a synchronized appropriately modulated voltage is applied to terminal 66 and thus to conducting substrate 64. When a potential of sufficient magnitude, which will be described later, is placed on conducting substrate 64, a very high field gradient is established between top and bottom of Langmuir film 67 at the point where the Langmuir film is bombarded by the electron beam. This potential causes charged mobile ions to move within the film. A bit of information is thus encoded into the film, and, as will later be shown, the film's surface potential and electron diffraction characteristics at the point of encodement are altered. Once data has been read into the memory it will not be erased by failure of power to the tube. Once ions' positions in a bit have been shifted, the electron beam must be addressed to the bit location and a properly synchronized potential applied to the substrate to erase the written bit. It may be necessary, however, to cool the tube to prevent thermal molecular agitation from causing ionic migration within the film during long term archival data storage.

To read out information stored as patterns of ionic distribution and surface potential on Langmuir film 67, the electron beam is scanned across the Langmuir film, as described above, at a reduced beam current ($10^{-9}$ to $10^{-12}$ amperes). Impact of this low energy electron beam on the Langmuir film's surface causes the surface to emit secondary and to reflect primary electrons. To be emitted the secondary electrons must overcome the film's surface potential at the point where they are emitted. The presence of a bit at a particular point on the Langmuir film's surface will be characterized by a surface potential differing from surface potentials of the surrounding film. The preferred embodiment of the invention writes a bit by reducing the film's surface potential at the selected address. Thus, where a bit has been written onto the film and its surface potential correspondingly reduced, less energy is required for an electron to escape from the film.

The angular distribution of emitted secondary electrons is different from that of primary electrons backscattered or reflected from the film's surface. Annular slit 62 at the base of collector 58 is so located, that statistically speaking, only secondary electrons representing the presence of a bit will pass through it. When the electron beam interacts in its read mode with the surface of the Langmuir film, secondary electrons are emitted from the particular point (or address) on the film. If a bit is stored at this point, electrons will pass through annular slit 62. Electrons passing through this slit can possess many different velocities. It is necessary to select low energy (i.e. low velocity) electrons to determine whether a bit is stored in the film at this point. Velocity selection is accomplished by means of velocity selector ring 86. The ring is negatively charged sufficiently to deflect slower electrons downward into channel 80 of secondary emission multiplier 74. Higher energy electrons are not sufficiently deflected by the charge applied to velocity ring 86 to enter the channel. Slower electrons, which represent the presence of a bit, are amplified by secondary emission between walls 78 and 76 of secondary emission multiplier 74 in a well known manner and produce an output current on ring 82 and thus at lead 84 of memory tube 20. Walls 76 and 78 of secondary emission multiplier 74 may be coated with a compound such as cesium oxide to insure high amplification when electrons representing a bit in memory impinge upon them.

A second, alternate, readout method that may be practiced in the preferred embodiment of the invention operates by detecting the presence or absence of ions, e.g. barium or sodium ions, in the upper portion of the barium stearate monolayer. This end is accomplished by means of low energy electron diffraction.

Basically, the primary electron beam sweeps the film's surface as described above. Beam current is reduced to the order of $10^{-11}$ amps.

The primary electron beam strikes the surface of Langmuir film 67. Because of its low potential the beam penetrates only a short distance into the film. The beam does not have sufficient energy to penetrate to the film's base, i.e. to the carboxylic ground plane of the barium stearate monolayer.

If ions, such as sodium or barium ions, are present near the film's surface, then their electron fields will diffract the electron beam. This effect is well known to the art and the state of the art is well illustrated by H. Rice, Low Energy Electron Diffraction and Surface Chemistry, 2 *Progress in Solid State Chemistry* 6–117.

The diffracted electron beam radiates in a characteristic pattern described in connection with FIG. 10, from the incident beam's point of impact on Langmuir film 67. The radial intensity distribution of this pattern differs depending on whether or not ions are present within the section of the Langmuir film penetrated by the primary electron beam. Since the writing method used in the preferred embodiment of the invention, as described above, causes ions to move from the top to the bottom of the film in order to store a bit, the electron diffraction pattern generated by the film at each bit storage address will be a function of whether or not a bit is stored in that location on the film.

Measurement of diffraction patterns generated by the film at a bit address provides a second readout means that may be used alone or in conjunction with the secondary electron readout means already described. The preferred embodiment of the invention utilizing diffraction readout means is shown in FIG. 13. In FIG. 13 like numbers indicate like parts to the other figures.

When ions are present in the upper layer of the Langmuir film, signalling the absence of a bit in the preferred embodiment of the invention, diffracted electrons 501 will fall in a pattern at points, i.e. 503, on the collectors's inner surface. FIG. 14 shows a section of FIG. 13 that includes hole 505 in collector 58 and shows the detail of a conducting mesh 507 that covers the hole. Thus some parts of this surface will receive a greater and some a lesser intensity of electron bombardment when ions diffract the electron beam.

The points of maximum bombardment are determined using a photographic emulsion to coat the collector's inner surface, or by any other accurate means. Holes 505 are then formed in the collector at these points. These holes are covered with a fine conducting mesh 507, which is electrically connected to the collector to prevent field distortion of the electric field maintained on the collector in connection with the secondary emission read out method described above. A second fine conducting mesh 509 is provided behind this first mesh. The second mesh electrically connected to terminal 511 is positively charged with respect to the collector. Behind this second mesh is a detecting means 513 for detecting the diffracted accelerated electrons, e.g. a scintillator crystal and a photo-multiplier or secondary emission multiplier. The detector's output exits the memory tube via lead 520.

Operationally, the diffracted electrons pass through the first mesh and are accelerated by the potential placed on the second mesh. This adds energy to the electrons. They then interact with the detection means to provide a signal that is a function of the presence or absence of ions in the upper levels of the Langmuir film.

It is desirable to provide such detectors at both points of maximum and minimum diffracted electron intensity on the collector as shown in the figure. When a bit is present, thus not producing diffraction, the normal cosine distribution of reflected primary electrons, illustrated by FIG. 10, will cause the maximum detector 515 and minimum detector 517 to have about the same output. When no bit is present, and thus the electrons are diffracted, these detectors will have greatly differing outputs.

The secondary emission and diffraction readout methods may be used simultaneously to insure detection of the presence of a bit at the irradiated address or they may be used separately. Either the presence or the absence of ions in the upper layers of the Langmuir film may be used to signal the presence of a bit of stored data.

In summary, the preferred embodiment of the invention operates as follows.

An electron beam from a field emission cathode is accelerated by an accelerating grid and then uniformly decelerated to a precise velocity by a decelerating tube. The electrons pass through an opening in a collector and strike a mono-molecular barium stearate Langmuir film doped with excess mobile ions deposited on a conducting substrate. The electron beam is swept in a raster pattern across the entire surface of the Langmuir film by magnetic fields produced by deflection coils. The film is then primed, or erased, by applying a contemporaneous voltage capable of mobilizing the ions towards the conducting substrate. To write a bit of information into the film, a charge is applied to the substrate when the electron beam is striking the bit location where it is desired to encode a bit. To read a bit of information, the electron beam current is reduced and the deflection coils cause the beam to fall on a desired spot on the film. Secondary electrons emitted from the Langmuir film's surface under electron bombardment by the low energy electron beam are analyzed. When the electron beam is irradiating a given position on the film's surface, secondary electrons emitted by the film from this location will be of a greater or lesser energy depending on whether the film's surface potential, at that exact point, is in the state representing 0 or 1. The emitted secondary electrons are discriminated from the primary electrons generated by the incident beam by means of a slit annularly provided about the base of the collector. Secondary electrons passing through this annular slit are further discriminated according to their velocity by means of a velocity selector ring charged just sufficiently to force low energy electrons into the channel of a secondary emission multiplier. Electrons whose presence represent a bit in the surface of the Langmuir film at the point of its instantaneous contact with the electron beam will be amplified by secondary emission multiplier 74 and detected as a current at multiplier output 84.

Figure 6:
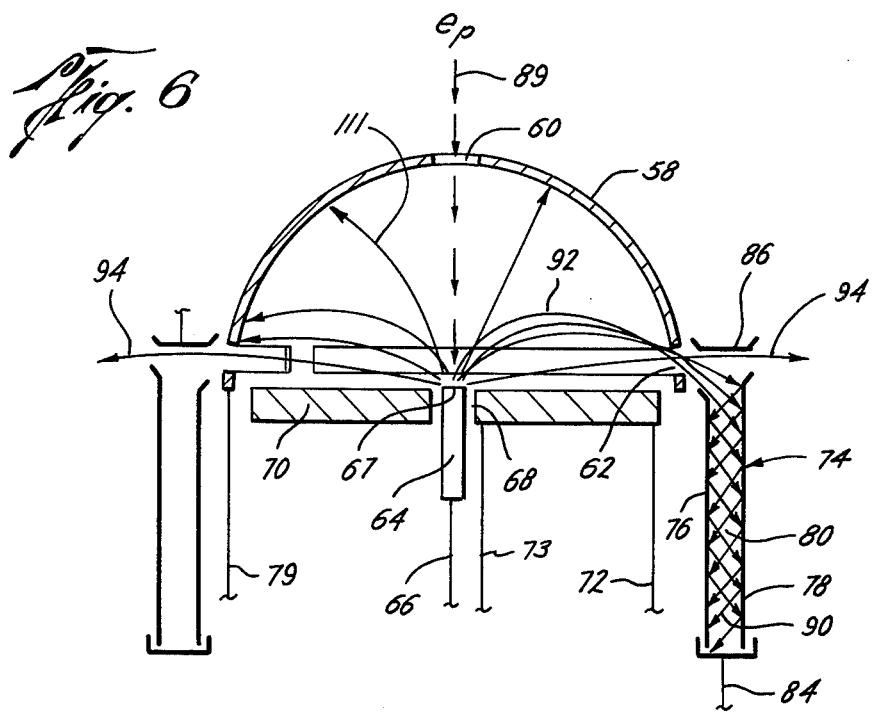
FIG. 6 is a portion of the memory storage tube shown in FIG. 1 also shown diagramatically in longitudinal cross section during the reading operation of the invention.
Figure 11:
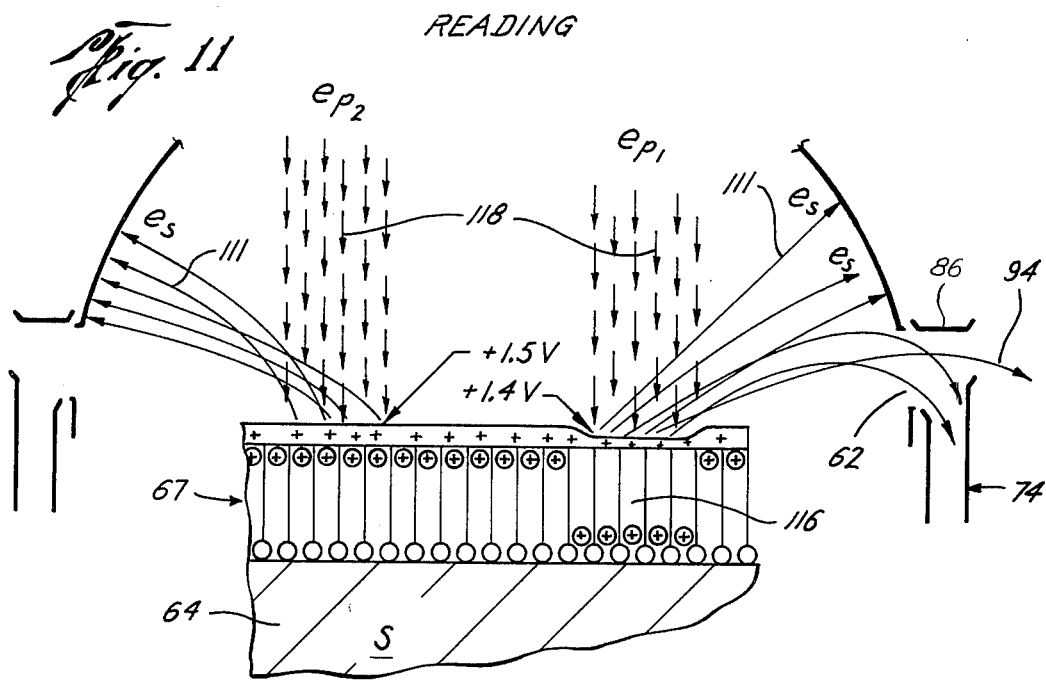
FIG. 11 is a diagramatic illustration shown in cross section of the memory element of the preferred embodiment of the invention shown diagramatically in the condition of reading out a bit of stored information.
Figure 12:
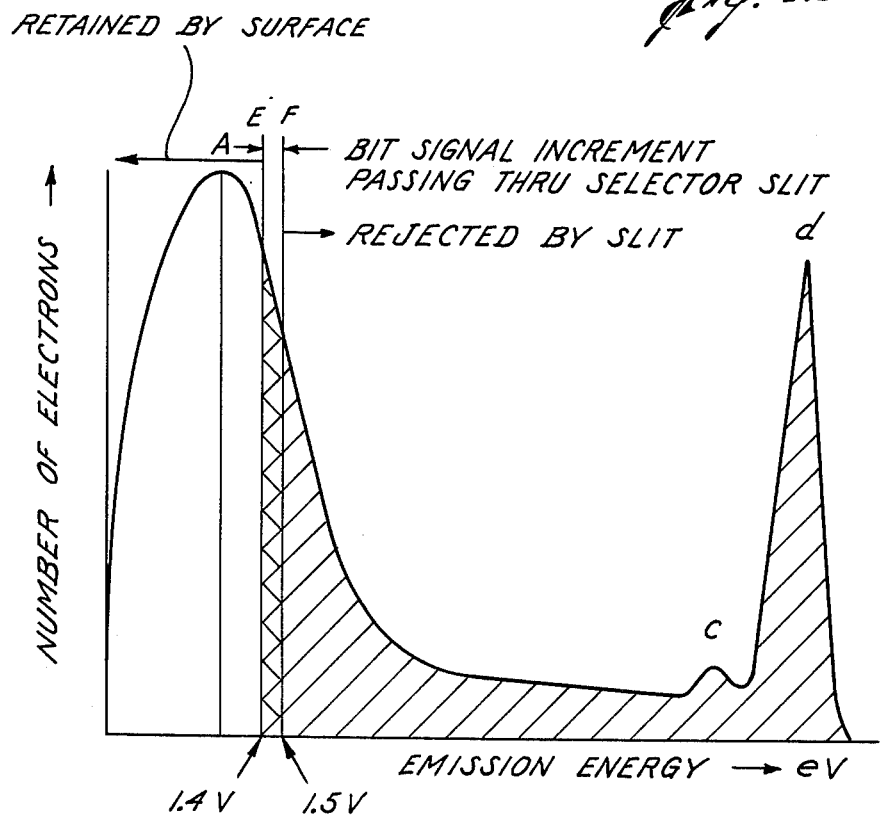
FIG. 12 is a graph of electron probability plotted against emission energy illlustrating the portion of the electron energy spectrum utilized by the preferred embodiment of the invention for information readout.

The primary beam current used in the read mode of the preferred embodiment of the invention is approximately $10^{-11}$ amperes. To read a bit of information using the apparatus disclosed by the preferred embodiment of the invention, deflection coils 36 (FIG. 1) are energized to position primary electron beam 89 on the proper storage address on Langmuir film 67. The beam then interacts with the film, as described above, and causes emission of secondary electrons from the film's surface. If a bit is present at the location being irradiated by the primary electron beam, then the surface potential at that point will be approximately 1.4 volts. Thus, the lowest energy electrons emitted by the surface at the point under the beam will have an energy of 1.4 electron volts. The upper edge of velocity selector slit, which is annular opening 62 running around the base of the collector 58, and the positive potential of deflector 70 are adjusted so electrons emitted from the Langmuir film's surface with an energy of 1.5 electrons volts or greater impinge upon the collector, as is shown in FIG. 11, where electrons 111 are diagramatically shown as having an energy above 1.5 electron volts and impinged upon the surface of collector 58. Electrons below the level of 1.4 electrons volts are never able to escape from the surface of the Langmuir film. This is because the film's surface potential traps them within the film. Where a bit has been written, the surface potential of the film is, in the case of barium stearate film, 1.4 volts. Electrons having energy levels of 1.4 volts can escape the surface at these points when irradiated by primary electron beam 89. The purpose of the velocity selector slit annularly running around the base of collector 58 is to filter out these low energy secondary electrons. Unfortunately, there are also a few high energy electrons emitted at a small angle to the substrate and these fast electrons also pass through velocity selector slit 62. Thus, when primary electron beam 89 irradiates an area containing a bit of information, both high velocity low angle electrons and low velocity low energy secondary electrons pass through velocity selector 62. Velocity filter 86 is provided annularly around the velocity selector slit to discriminate between these fast electrons and the slow electrons having energy levels of 1.4 volts that indicate the presence of a bit in the Langmuir film under the primary electron beam. A negative potential is applied to this ring. The potential, being negative, bends the paths of all negatively charged electrons coming through slit 62 downward toward the entrance to secondary emission multiplier 74. Fast electrons, however, are not deflected as greatly as are slow secondary electrons. Thus, fast electrons, such as 94, shown diagramatically in FIG. 6 and 11 curve only slightly and pass far above the upper lip of secondary emission multiplier 74's rear wall 78. Lower energy (signal carrying) electrons, however, such as electron 92, shown diagramatically in FIG. 6, are greatly deflected by the negative charge on velocity filter ring 86 and are forced downward into the upper opening of secondary emission multiplier 74. They strike cesium oxide covered wall 78 of the multiplier and generate additional secondary electrons, which are greatly amplified as they cascade down through the channel multiplier. Eventually the amplified signal falls upon collector electrode 82 and passes as a detectable current through terminal 84. The presence of a signal at terminal 84, when the primary electron beam is irradiating a particular location on the film's surface indicates data is written into that location, If the low current read electron beam is swept in a regular raster pattern across the surface of langmuir film 67, then a modulated signal will appear at the output terminal 84 of secondary emission multiplier 74, which represents, in the form of a string of pulses, the information stored on the film being scanned by the raster of the primary electron beam.

Beam diameter and memory films used in the preferred embodiment of the invention yield a bit domain that is roughly circular and approximately 100 angstroms in diameter. There are 10,000 angstroms in one micron and 1,000 microns in a millimeter. Thus, the preferred embodiment of the invention, is capable of storing $10^4$ bits of information in one square micron or $10^{10}$ bits of information in 1 square millimeter. A square of memory film in the preferred embodiment of the invention approximately 10 millimeters by 10 millimeters square, or 1 square centimeter (100 square millimeters) can store $10^{12}$, or a trillion, bits of information. In more comprehensible terms, one memory tube, according to the preferred embodiment of the invention, using less than one-fourth of a square inch of memory material, in capable of storing the date contained in 10,000 written volumes the size of those used by the Encyclopedia Britannica.

Although certain operational and preferred embodiments of the invention have been disclosed and described by this application, many modifications incorporating the advantageous features of this invention will immediately be apparent to those skilled in the art of digital memory design and physical chemistry. Accordingly, the invention is not to be limited to the specific embodiment shown and described, but only as set forth by the appended claims.

I claim:
1. A data storage apparatus comprising
   a plurality of charged particles;
   a film adapted to contain the charged particles in a plurality of positions;
   writing means for altering said particles' positions within said film; and reading means for determining the presence of said particles at each of said positions in said film 2. A data storage apparatus as in claim 1 wherein said plurality of charged particles comprise a plurality of ions.

3. A data storage apparatus as in claim 2 wherein said ions are members of the class of mono valent and divalent ions.

4. A data storage apparatus as in claim 3 wherein said ions are barium ions.

5. A data storage apparatus as in claim 3 wherein said ions are sodium ions.

6. A data storage apparatus as in claim 1 wherein said film is thin.

7. A data storage apparatus as in claim 6 wherein said film is mono-molecular.

8. A data storage apparatus as in claim 6 wherein said film is organic.

9. A data storage apparatus as in claim 8 wherein said film is a Langmuir film.

10. A data storage apparatus as in claim 10 wherein said Langmuir film is composed of barium stearate.

11. A data storage apparatus as in claim 6 wherein said film is amorphous.

12. A data storage system as in claim 1 wherein said writing means comprises a charged particle emitter directed so the emitted particles interact with said plurality of charged particles in said film.

13. A data storage apparatus as in claim 12 wherein said emitted particles comprise an electron beam directed so as to bombard a spot having an address on the film's surface.

14. A data storage apparatus as in claim 13 wherein said spot's address on the film's surface and said spot's intensity are controlled by interaction of the electron beam with electromagnetic and electrostatic fields.

15. A data storage apparatus as in claim 14 wherein said film is on a conducting substrate, and including means for applying a variable potential to said substrate in synchronization with the address of said spot on the film.

16. A data storage apparatus as in claim 15 wherein said variable potential is of sufficient intensity to alter the position of said charged particles in the film.

17. A data storage apparatus as in claim 16 and including means for operating said variable potential and said electron beam in synergistic manner to alter the position in the film of charged particles within the addressed portion of the film whose surface is affected by the electron beam.

18. A data storage apparatus as in claim 17 wherein said electron beam is directed to strike the addressed spot on the film's surface at an acute angle.

19. A data storage apparatus as in claim 17 wherein said means for synergistic operation includes means for applying sufficient potential to the film's surface to cause secondary electron emission from the film's surface at the bombarded address.

20. A data storage apparatus as in claim 17 wherein said alteration of the charged particles' position is in a direction normal to the film's surface.

21. A data storage apparatus as in claim 20 wherein said alteration of said charged particles positions changes the surface potential of the film at the address wherein the particles positions are altered.

22. A data storage apparatus as in claim 1 wherein said reading means comprises an analyzer means for measuring the surface potential of the film at any desired address.

23. A data storage apparatus as in claim 22 wherein said analyzer means comprises
an electron beam having sufficient intensity to cause secondary electrons to be emitted from the film bombarding said address on said film whose surface potential is to be measured;
an electrically charged collector having an inner surface hemispherically surrounding the bombarded side of the film and provided with an opening for the passage of said electron beam;
an annular disc having a nonlinearly distributed high resistivity coating located beneath said collector and below said slit adapted to produce a shaped electrostatic field when an electric current is passed between its inner and outer peripheries;
an annular slit around the base of said hemispherical collector adapted to pass electrons; and
an electron detecting means located radially outward of said means for detecting the presence of electrons passing through the slit.

24. A data storage apparatus as in claim 23 wherein said electron beam has a potential of between 1 and 100 volts and a current of between $10^{-9}$ and $10^{-12}$ amperes;
said hemispherical collector is maintained at a potential sufficient to maintain a surface potential of between 1 and 2 volts between the surface of said film and said collector caused by said electron bombardment;
said shaped electrostatic field about said disc is adapted to cause a separation of the points at which secondary electrons emitted from said surface at differing energy intersect said collector's inner surface;
said annular slit is adapted in width and position on said collector to only allow passage of secondary electrons having energies within a desired range; and
the electron detecting means is a secondary emission electron multiplier adapted to provide an amplified output signal responsive to electrons passing through the slit.

25. A data storage apparatus as in claim 23 and including:
a velocity selector ring located intermediate said slit and said multiplier havvng an electric potential sufficient to deflect electrons and adapted to deflect only electrons having less than a desired energy into said multiplier.

26. A data storage apparatus as in claim 25 wherein said velocity selector ring is adapted to deflect only secondary electrons into said multiplier.

27. A data storage apparatus as in claim 24 wherein said collector is a hemispherically shaped solid conducting piece surrounding a plurality of holes, said holes being covered with a conducting grid to prevent field distrotion.

28. A data storage apparatus as in claim 1 wherein said reading means comprises:
electron diffraction means adapted to detect the presence of a plurality of ions at a specific address relatively near the surface of the film.

29. A data storage apparatus as in claim 28 wherein said electron diffraction means comprises:
a low energy electron beam bombarding an address on said film;

a hemispherical collector surrouunding a plurality of holes, said holes being positioned at the loci on said collector intersecting relative maximum and relative minimum electron flux when said electron beam is bombarding an address having a plurality of ions near enough to the surface of said film to diffract said beam; and detection means positoned behind said holes for detecting the flux of electrons passing therethrough.

30. A data storage apparatus as in claim 29 wherein said detection means is a secondary emission electron multiplier.

31. A data storage apparatus as in claim 29 and including mesh screens proximate said holes charged to a relatively high potential with respect to said collector adapted to accelerate electrons passing therethrough and wherein said detection means constitutes a plurality of scintillation crystals adapted to intercept accelerated electrons passing through said screens and a coordinate plurality of photo-detectors adapted to report the output of said scintillation crystals.

32. A data storage device as in claim 29 and including a conducting mesh covering said plurality of holes.

33. A data storage device as in claim 1 wherein said reading means includes electron diffraction means and surface potential analyzer means for detecting the presence of a bit stored at an address on said film.

34. A data storage device as in claim 1 wherein said containment means comprises an evacuated tube.

* * * * *